(12) United States Patent
Cappelli et al.

(10) Patent No.: US 9,822,261 B2
(45) Date of Patent: Nov. 21, 2017

(54) COMPOUND WHEREIN CONDUCTIVE CIRCUITS CAN BE MADE

(71) Applicant: SPF LOGICA S.R.L., Montebelluna (IT)

(72) Inventors: Fabio Cappelli, Montebelluna (IT); Giuseppe Paronetto, Montebelluna (IT); Giorgio Eberle, Montebelluna (IT)

(73) Assignee: SPF LOGICA S.R.L., Montebelluna (TV) (IT)

( * ) Notice: Subject to any disclaimer, the term of this patent is extended or adjusted under 35 U.S.C. 154(b) by 268 days.

(21) Appl. No.: 14/423,024

(22) PCT Filed: Aug. 16, 2013

(86) PCT No.: PCT/IB2013/056685
§ 371 (c)(1),
(2) Date: Feb. 20, 2015

(87) PCT Pub. No.: WO2014/030109
PCT Pub. Date: Feb. 27, 2014

(65) Prior Publication Data
US 2015/0210866 A1    Jul. 30, 2015

(30) Foreign Application Priority Data

Aug. 20, 2012 (IT) .............................. TV2012A0166

(51) Int. Cl.
| | | |
|---|---|---|
| *B32B 3/00* | (2006.01) | |
| *C09D 5/24* | (2006.01) | |
| *C09D 165/00* | (2006.01) | |
| *H05K 3/10* | (2006.01) | |
| *H01B 1/22* | (2006.01) | |

(52) U.S. Cl.
CPC ............. *C09D 5/24* (2013.01); *C09D 165/00* (2013.01); *H01B 1/22* (2013.01); *H05K 3/105* (2013.01); *C08G 2261/3223* (2013.01); *H05K 2201/0215* (2013.01); *H05K 2201/0329* (2013.01); *H05K 2203/104* (2013.01); *H05K 2203/107* (2013.01)

(58) Field of Classification Search
CPC ....................................................... C09D 11/52
USPC ......................................................... 428/208
See application file for complete search history.

(56) References Cited

U.S. PATENT DOCUMENTS

| | | |
|---|---|---|
| 5,182,050 A | 1/1993 | Joyce, Jr. et al. |
| 2007/0173564 A1 | 7/2007 | Sohn et al. |
| 2010/0040846 A1* | 2/2010 | Bahnmuller ........... C09D 11/52 428/208 |
| 2011/0059234 A1 | 3/2011 | Byun et al. |

FOREIGN PATENT DOCUMENTS

| | | |
|---|---|---|
| WO | WO 2006/080639 A1 | 8/2006 |
| WO | WO 2009/117460 A1 | 9/2009 |
| WO | WO 2011/125037 A2 | 10/2011 |

OTHER PUBLICATIONS

H.-K. Roth et al: "Electronic properties of laser modified poly(bis-alkylthio-acetylene)", Synthetic Metals, vol. 101, No. 1-3, May 1, 1999, XP055030455, pp. 832-833.

* cited by examiner

*Primary Examiner* — Khanh Tuan Nguyen
(74) *Attorney, Agent, or Firm* — Birch, Stewart, Kolasch & Birch, LLP

(57) ABSTRACT

To improve the characteristics of a compound adapted to create inside an electrically conductive track or area, the compound comprising a solvent, a polymer with double covalent conjugate bond, namely a heterocyclic compound formed by n carbon atoms and one atom of a different type linked in a ring structure; and a dispersion of conductive particles, there is added an agent adapted to slow down the precipitation of the conductive particles within the material.

13 Claims, No Drawings

COMPOUND WHEREIN CONDUCTIVE CIRCUITS CAN BE MADE

The invention relates to a compound, e.g. to be spread or sprayed on any surface, in which to create conductive circuits and/or circuits able to generate electric charges, in the form of signal or current. The compound can be modified by an electromagnetic field to vary its electrical conductivity.

To wire surfaces or equipments is an expensive and laborious operation. The length of the cables, their cost and weight will often affect it overwhelmingly, sometimes up to discourage the beginning of the work.

WO2011125037 teaches how to create conductive tracks in a volume of material due to molecules polarizable in a stable manner. To polarize the molecules in the material a magnetic radiation is sent so as to provide the necessary energy to locally vary the excitation state of one or more molecules. In the natural non-excited state the molecules are not electrically conductive.

During experiments the goal was set of improving the characteristics of the compound, in particular to lower the electrical resistivity thereof. The solution was to add to the compound conductive particles, e.g. made of metal such as silver (Ag).

The particles form chains which assist the polymer chains made conductive by the electromagnetic radiation by creating conductive bridges across the inevitable interruptions between two neighboring polymeric chains, and/or by creating a low resistance path in parallel with the polymeric chains. The result is a reduction of the electrical resistance of the track.

The displacement of the particles can be achieved in a simple and natural manner if the electromagnetic radiation is able to vary the concentration and/or the spatial arrangement of the particles by altering a substance in which the particles are dispersed. The substance modifies to leave an empty space in which the particles, suspended in the material having molasses or gelled form, migrate by diffusion or gravity.

The migration of particles allows an aggregation of particles in the area struck by the radiation where a polymeric conductive track forms and distances them away from the remaining particles. This forms insulating furrows, at the margins of a zone in the volume, which constitute the edges of a conductive track or area.

An unexpected and unpredictable problem after the addition of the conductive particles was the occurrence of accidental shortcircuits. It has been found that the particles, by gravity and/or specific weight, migrate to the extremes of the layer of compound that contains them. If such a layer of compound is deposited on a conducting or metal support, the conductive tracks within the layer of compound, or even the whole layer, are short-circuited.

It is necessary to resolve this problem, while maintaining the conductive particles inside the compound to preserve the properties of low resistivity.

The solution is defined in the appended claims, i.e in general a material suitable for making inside it an electrically conductive track or area, comprising
 a solvent,
 a polymer with double covalent conjugate bond, namely
  a heterocyclic compound formed by n carbon atoms and one atom of a different type linked in a ring structure, and
 a dispersion of conductive particles,
characterized in that it further comprises
an agent adapted to slow down the precipitation of the conductive particles within the material.

The agent blends well with the particles, e.g. made of silver, and supports them as a "parachute", slowing down their precipitation. The particles precipitate in the material due to different specific weight, but now more slowly. The material solidifies due to evaporation of the solvent, and, in the solidified material, the precipitating particles have run as a result of the agent a shorter distance, thereby failing to reach the margins of the material.

A type of agent can be the silicone, that also serves to isolate the conductive particles between each other before e.g. a laser burns it when the tracks are created. Such a property is very useful when using PATAC as the polymer.

The dosage of silicone/silver must be quite accurate.

Preferred values for the material by weight are:
 60% of PATAC or $P_3HT$+dichlorobenzene as a solvent;
 40% of silicone and silver, in turn divided into 90% of silver and 10% silicone.

The material/compound contains preferably dispersed within a generic solvent all the elements here described, preferably an aromatic solvent. In particular, it is preferred to use, as a solvent, benzene, and preferably a dichlorobenzene (because it melts the Thiophene and the PATAC), a dichloromethane or diluents like nitro.

Then the compound can be spread or sprayed on any surface. It can comprise metal oxides, which are useful because they make electrons available in the matrix/compound.

In general, the polymeric matrix can comprise a polymer with double covalent conjugate bond, i.e. an heterocyclic compound formed by n carbon atoms and one atom of a different type (sulfur in Thiophene) linked in a ring structure, in particular PATAC or Thiophene.

The PATAC belongs to the family of polyacetylenes, and represents a generic family of photopolymers that require only exposure to a laser to become electrical conductors through breaking of the lateral tio-alchilic chains. After exposure to the laser, the struck areas lose part of the lateral tio-alchilic chains and thus a blue-black polymer is obtained, insoluble and conductive. The PATAC is also a polymer with double covalent conjugate bond, namely a heterocyclic compound consisting of n carbon atoms and one atom of different type (or radical) linked in a ring structure.

Another type of agent as defined above can be achieved by varying the molecular density of said polymer, in particular a Thiophene or polythiophene, polymer here taken as an example. Namely, thiophene is polymerized to form longer chains, and capable of slowing down the conductive particles. The increased molecular mass of the polymer (function of the polymerization time and the amount of diluent during the synthesis) creates a mesh that slows down the precipitation of conductive particles.

A thiophenic chain reaches about 30 nm of maximum length, but the meshing of the chains thickens, bringing them closer, so that the gaps between the chains are smaller.

E.g. $P_3HT$ so prepared can be used:
 10 gr of 3-hexylthiophene (the monomer),
 300 ml of chloroform (diluent),
 20 gr of $FeCl_3$ (ferric trichloride anhydrous).

The mixture is left for 1 hour at room temperature under agitation. Then it is all filtered. What is in the filter is the polymer (Thiophene) and is to be washed (always keeping it on the filter) with methanol. Then all is dried in an oven at 60-70° C. to evaporate the methanol.

At that point, the polymer is ready to be dissolved in the solvent of the above-mentioned compound. It has been found experimentally that e.g. passing from 300 to 250 ml of chloroform makes the product more dense, and thus able to retain better e.g. the Ag and to prevent it from depositing.

The final density of the polymer in the compound that gives the effect described on the conductive particles is a function of many variables, e.g. the type of particles, the amount and type of solvent, etc.

The usually produced Thiophene or polythiophene has some gaps in the molecular lattice of 500-600 nm, through which the (commercially available) particles pass.

The preparation described here has the object to reduce the dimensions of such gaps (e.g. the diameter or the maximum size and/or the maximum distance between the branchings of the polymer) to a maximum of 400 nm, a value at which the described effect of particle suspension manifests.

Even better results are obtained if such gaps or distances have dimensions less than 100 nm, preferably equal to or less than 40-50 nm. In fact, the particles can have a size distributed statistically in a range of values, therefore the percentage of smaller particles could pass through the polymer chains.

The smaller the size of the gaps or the distance between branches, the lesser the percentage of particles passing through the polymer lattice.

Another agent can be a resin, e.g. an organic-mineral resin. An example of resin is the PET plus calcium.

The choice of the type of electromagnetic stimulus to be used on the polymer is important as too bland a stimulus is not sufficient to break the carbon-sulfur bonds, while too energetic a stimulus gives rise to a form of pyrolysis which leads to an insulating material. The preferred laser to strike the PATAC is a laser with wavelength of 488 nm.

Preferably the PATAC in the compound is used only as amalgam for the components, and not to create polymeric conductive chains, as instead the Thiophene or $P_3HT$ do. The PATAC is burned by the passage of the laser.

The compound can be applied in liquid or gelled form directly on a support or applied via a separate film or layer of rigid or flexible support.

The conductivity of the compound is improved—as mentioned—by the presence of the aggregants or the conductive particles, such as Ag, Ni, St, Au or Pt.

The silver, or one of Ni, St, Au or Pt, has given excellent results of conductivity. The silver particles, initially isolated from the polymer, stick to one another when the PATAC or Thiophene or carbon-based polymer in the compound is struck by the laser, and in the compound a chain of conductive particles in contact with each other is created.

With the same object of operation, compounds can be added such as carbon black, and/or components of carbon black and/or carbon nanotubes.

The compound enables to exploit its electrical peculiarities also for the generation of electrical power or mechanical vibrations, see below.

In the solvent there can be present metal oxides, and/or a further component such as a graphite or graphene, excellent dopants, primarily for their high electrical conductivity.

The metal oxides can be added with ferric chloride or aluminum chloride, with or without coloring pigments.

The metal oxides can for example be constituted of iron oxides in the formulation $Fe_2O_3$, or $Fe_3O_4$ or even better, for their better magnetization/saturation curve, of chromium oxides or dioxides, in the formulation $CrO_2$.

With a laser, or other electromagnetic radiation, the compound is struck to energize or de-energize the molecules of Thiophene by sending the right energy. When they are excited, their electronic state changes and they become conductive. A subsequent radiation pours energy on the excited molecule and returns it to the original electronic configuration, that is an insulator.

In particular, the laser radiation breaks down in the Thiophene the binding of the radical containing sulfur, leaving the polymeric chains in mutual electronic and conductive contact through the free orbital. A subsequent radiation restores the link with the free radical and/or cuts out again the Thiophenic chains, and the compound turns back insulator at that spot.

Clearly, by the Laser one can create tracks or conductive areas in the compound at will.

In particular, the compound can be loaded with a quartz-based filler (one or more of its 19 families), in particular $BaTiO_3$ or $PbTiO_3$. A component with $TiO_3$ has the advantage of being very gripping, not dry and has the possibility with low energy to make electrons available.

In the compound there is preferably dispersed quartz with different particle sizes, both for conveying charges toward the polymer, and as a voltage/current generator via piezoelectric effect.

In fact, a pressure by an object on the compound generates in the quartz a discharge or a current pulse. By pressing and releasing periodically the compound one can generate a pulsating current. This current can be collected e.g. by one or more tracks of PATAC or Thiophene made conductive.

Another surprising consequence is that one can draw at will on the paint (through polarization) some vibration-generating areas. Alternatively, or in addition, one can activate the vibration in areas picked at will having at disposal an electrical excitation for the quartz.

The problem of preventing short-circuits described above is equally solved by the method as generally defined in claim 6, which allows to limit the speed and/or the number of particles that precipitate in the material. Advantageous variants of the method are defined in the dependent claims.

In general, a compound such as that described can also operate as a sensor, e.g. to measure the mechanical stress (tension or compression) to which a surface is subjected, as a strain-gauge.

By drawing a conductive path in the material deposited on a surface, it has been observed experimentally that the trend of its resistance value is linear when the elongation varies. In particular, a surface coated with the above material, if subjected to a load (tensile or compressive), varies its electrical resistance compared to the value at rest (no load).

At the disappearance of the load, the resistance of the material returns to its rest value.

E.g. a sample of 10 cm on a support of polyacetal (1 cm×10 cm) subjected to 1 Kg, varies its resistance by 10Ω compared to its rest value without load being about 160Ω.

Obviously, the linearity in the resistance variation of the material depends on the stretching or compression linearity of the support. The molecular chains of the material, e.g. the PATAC or Thiophene, within certain limits stretch with linearity and return to the rest, unloaded point.

The invention claimed is:

1. A compound material suitable for creating an electrically conductive track or area inside the material, comprising:
   a solvent,
   a polymer with double covalent conjugate bond,
   a dispersion of conductive particles, and an agent adapted to slow down precipitation of the conductive particles within the material, wherein said agent comprises a mineral resin.

2. The material according to claim 1, wherein said agent comprises silicone.

3. The material according to claim 1, wherein said agent comprises said polymer.

4. The material according to claim 3, wherein said polymer comprises a polythiophene.

5. The material according to claim 1, wherein a size of gaps in a lattice formed by the polymer and/or a maximum distance between branches of the polymer is at most 400 nm.

6. The material according to claim 5, wherein the size of the gaps in the lattice formed by the polymer and/or the maximum distance between its branches is at most 100 nm.

7. The material according to claim 5, wherein the size of the gaps in the lattice formed by the polymer and/or the maximum distance between its branches is less than or equal to 50 nm.

8. The material according to claim 5, wherein the size of the gaps in the lattice formed by the polymer and/or the maximum distance between its branches is less than or equal to 40 nm.

9. The material according to claim 1, wherein the polymer with double covalent conjugate bond comprises a heterocyclic compound formed by n carbon atoms and one atom of a different type linked in a ring structure.

10. A method for maintaining a dispersion of conductive particles within, and at a certain distance from borders, of a compound material suitable for creating an electrically conductive track or area inside the material, the material further comprising:

a solvent, and a polymer with double covalent conjugate bond, wherein the method comprises slowing down precipitation of the conductive particles within the material with an agent comprising a mineral resin while the material solidifies.

11. The method according to claim 10, wherein the precipitation is slowed down by means of silicone.

12. The method according to claim 10, wherein the precipitation is slowed down due to a density of the polymer and/or a proximity of its molecular chains.

13. The method according to claim 10, wherein the polymer with double covalent conjugate bond comprises a heterocyclic compound formed by n carbon atoms and one atom of a different type linked in a ring structure.

* * * * *